United States Patent
Han et al.

(10) Patent No.: US 10,468,432 B1
(45) Date of Patent: Nov. 5, 2019

(54) BEOL CROSS-BAR ARRAY FERROELECTRIC SYNAPSE UNITS FOR DOMAIN WALL MOVEMENT

(71) Applicant: INTERNATIONAL BUSINESS MACHINES CORPORATION, Armonk, NY (US)

(72) Inventors: Jin Ping Han, Yorktown Heights, NY (US); Ramachandran Muralidhar, Mahopac, NY (US); Paul M. Solomon, Yorktown Heights, NY (US); Dennis M. Newns, Yorktown Heights, NY (US); Martin M. Frank, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/992,960

(22) Filed: May 30, 2018

(51) Int. Cl.
| | |
|---|---|
| *H01L 27/1159* | (2017.01) |
| *H01L 27/11585* | (2017.01) |
| *G11C 11/56* | (2006.01) |
| *H01L 27/24* | (2006.01) |
| *G11C 11/22* | (2006.01) |
| *H01L 27/11587* | (2017.01) |

(52) U.S. Cl.
CPC ...... *H01L 27/11585* (2013.01); *G11C 11/225* (2013.01); *G11C 11/5657* (2013.01); *H01L 27/11587* (2013.01); *H01L 27/2418* (2013.01); *H01L 27/2463* (2013.01)

(58) Field of Classification Search
None
See application file for complete search history.

(56) References Cited

U.S. PATENT DOCUMENTS

| | | |
|---|---|---|
| 4,046,455 A | 9/1977 | Kumada et al. |
| 4,088,391 A | 5/1978 | Kumada et al. |
| 4,262,339 A | 4/1981 | Geary |
| 4,360,894 A | 11/1982 | Geary |
| 6,555,293 B1 | 4/2003 | Fejer et al. |
| 7,145,714 B2 | 12/2006 | Roberts et al. |
| 7,486,432 B2 | 2/2009 | Chu et al. |
| 9,135,973 B2 | 9/2015 | Ohno et al. |
| 2016/0020382 A1* | 1/2016 | Levy ............... G11C 11/1675 335/284 |

* cited by examiner

*Primary Examiner* — Minh Loan Tran
(74) *Attorney, Agent, or Firm* — Tutunjian & Bitetto, P.C.; Vazken Alexanian

(57) ABSTRACT

A method is presented for incorporating a metal-ferroelectric-metal (MFM) structure in a cross-bar array in back end of the line (BEOL) processing. The method includes forming a first electrode, forming a ferroelectric layer in direct contact with the first electrode, forming a second electrode in direct contact with the ferroelectric layer, such that the first electrode and the ferroelectric layer are perpendicular to the second electrode to form the cross-bar array, and biasing the second electrode to adjust domain wall movement within the ferroelectric layer.

20 Claims, 8 Drawing Sheets

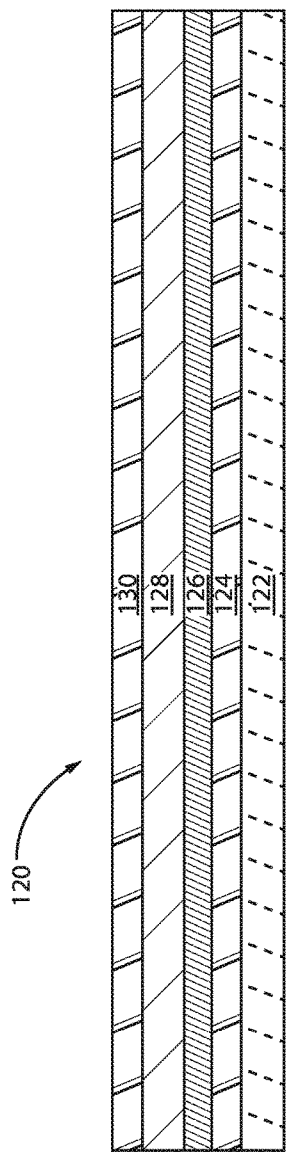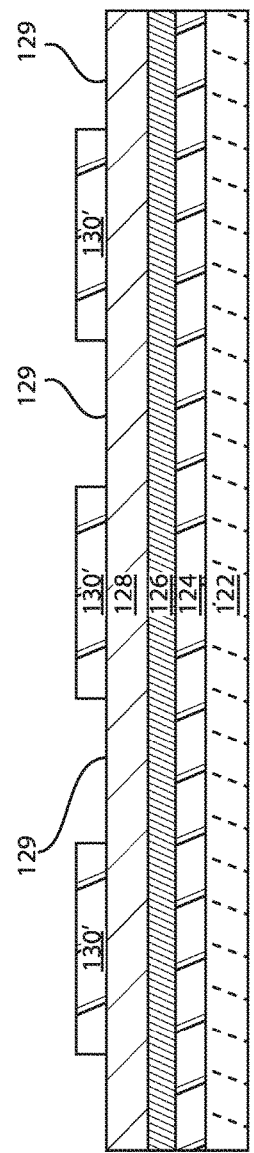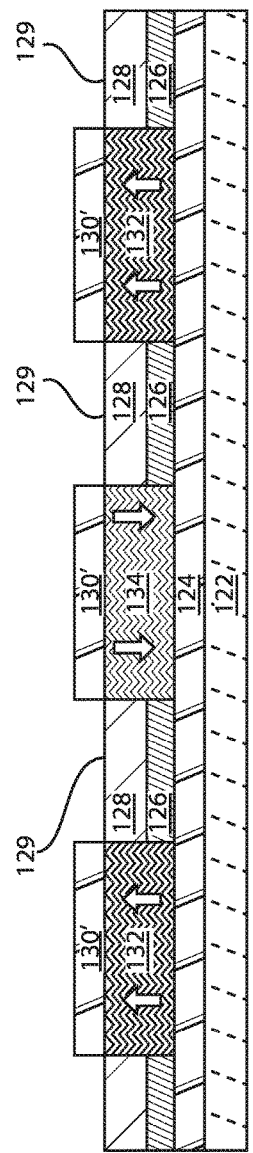
FIG. 12
FIG. 13
FIG. 14

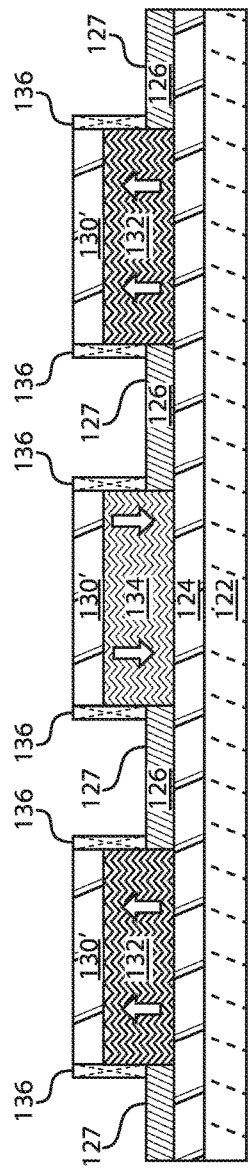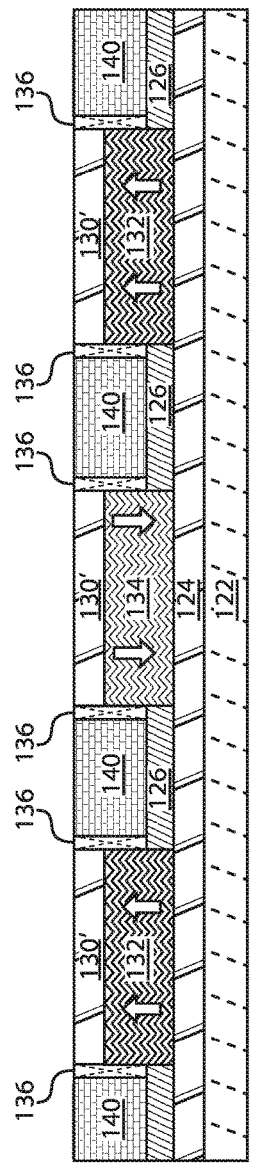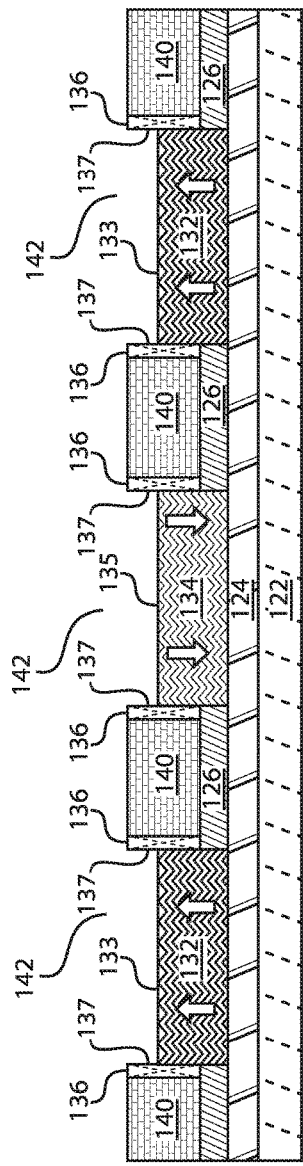

BEOL CROSS-BAR ARRAY FERROELECTRIC SYNAPSE UNITS FOR DOMAIN WALL MOVEMENT

BACKGROUND

Technical Field

The present invention relates generally to information storage devices, and more specifically, to a cross-bar array ferroelectric synapse unit for domain wall movement.

Description of the Related Art

In magnetic domain information storage devices, a magnetic region that constitutes a magnetic body is referred to as a magnetic domain. A boundary portion between magnetic domains is referred to as a magnetic domain wall. The magnetic domain walls have different magnetization directions relative to the magnetic domains. The magnetic domain walls have given volumes, and can be moved in the magnetic body by applying a current to the magnetic body. For example, the magnetic domain wall can be moved by applying a torque to the magnetic domain wall using electrons having a particular spin direction by applying a current to the magnetic body having the magnetic domain wall. This technique is referred to as magnetic domain wall movement by spin transfer torque. In addition, both voltage and current driven approaches have been proposed to convert a ferroelectric multi-domain wall into a single domain wall, and then move the domain wall symmetrically back and forth with opposite polarity of pulses.

SUMMARY

In accordance with an embodiment, a method is provided for incorporating a metal-ferroelectric-metal (MFM) structure in a cross-bar array in back end of the line (BEOL) processing. The method includes forming a first electrode, forming a ferroelectric layer in direct contact with the first electrode, forming a second electrode in direct contact with the ferroelectric layer, such that the first electrode and the ferroelectric layer are perpendicular to the second electrode to form the cross-bar array, and biasing the second electrode to adjust domain wall movement within the ferroelectric layer.

In accordance with another embodiment, a metal-ferroelectric-metal (MFM) structure in a cross-bar array is presented. The MFM includes a first electrode, a first ferroelectric layer in direct contact with the first electrode, a second electrode in direct contact with the first ferroelectric layer, such that the first electrode and the first ferroelectric layer are perpendicular to the second electrode to construct a cross-bar array, and biasing members for biasing the second electrode to adjust domain wall movement within the first ferroelectric layer.

In accordance with another embodiment, a metal-ferroelectric-metal (MFM) structure in a cross-bar array is presented. The MFM includes a first electrode, a first ferroelectric layer in direct contact with the first electrode, a second ferroelectric layer disposed over the first ferroelectric layer, a second electrode in direct contact with the first and second ferroelectric layers, such that the first electrode and the first ferroelectric layer are perpendicular to the second electrode and the second ferroelectric layer to construct a cross-bar array, and biasing members for biasing the second electrode to adjust domain wall movement within the first ferroelectric layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 12 is a cross-sectional view of a metal-ferroelectric-metal (MFM) structure including a bottom electrode, a first ferroelectric layer, a second ferroelectric layer, and a sacrificial top electrode, in accordance with an embodiment of the present invention;

FIG. 13 is a cross-sectional view of the MFM structure of FIG. 12 where the sacrificial top electrode is patterned, in accordance with an embodiment of the present invention;

FIG. 14 is a cross-sectional view of the MFM structure of FIG. 13 where pinning regions are established between the bottom electrode and the patterned sacrificial top electrodes, in accordance with an embodiment of the present invention;

FIG. 15 is a cross-sectional view of the MFM structure of FIG. 14 where remaining portions of the second ferroelectric layer are removed, in accordance with an embodiment of the present invention;

FIG. 16 is a cross-sectional view of the MFM structure of FIG. 15 where a top electrode is deposited, in accordance with an embodiment of the present invention; and FIG. 17 is a cross-sectional view of the MFM structure of FIG. 16 where the patterned sacrificial top electrodes are removed, in accordance with an embodiment of the present invention.

Throughout the drawings, same or similar reference numerals represent the same or similar elements.

DETAILED DESCRIPTION

Embodiments in accordance with the present invention provide methods and devices for improving data storage by implementing cross-bar array structures including ferroelectric layers for domain wall movement for symmetric operation. The magnetic domain wall movement principle can be applied to a data storage device. When the magnetic domain wall movement principle is applied to a data storage device, since the magnetic domain wall movement allows the magnetic domains to pass by a read/write head, read/write operations are possible without rotation or any physical movement of a recording medium.

Embodiments in accordance with the present invention provide methods and devices for inserting ferroelectric layers over bottom electrodes of a metal-ferroelectric-metal (MFM) structure. As the domain wall moves, the overall resistance of the MFM changes as a fraction of the MFM that is ON changes. The resistance is proportional to the fraction of device area that is OFF and, therefore, by pulsing a top electrode, the resistance can be changed and controlled. The MFM device is in read mode with a READ voltage less than a threshold voltage needed for domain wall motion, which can mitigate READ disturb effects. Thus, a back end of the line (BEOL) ferroelectric cross-bar array can be implemented for MFM with pinning or current source lines embedded for domain wall movement for symmetric operation.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
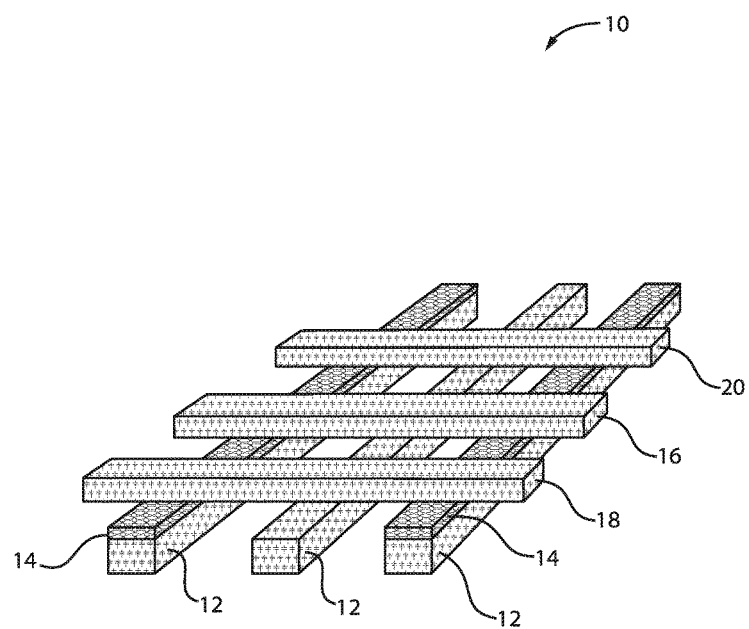
FIG. 1 is a perspective view of a cross-bar array incorporating a plurality of ferroelectric layers, in accordance with an embodiment of the present invention.

FIG. 1 is a perspective view of a cross-bar array incorporating a plurality of ferroelectric layers, in accordance with an embodiment of the present invention.

In various example embodiments, a cross-bar array 10 incorporating a plurality of ferroelectric layers 14 is shown. The ferroelectric layers 14 are positioned between bottom electrodes 12 and top electrodes 16, 18, 20. The ferroelectric layers 14 are positioned over and in direct contact with the bottom electrodes 12. The ferroelectric layers 14 are parallel to the bottom electrodes 12. The ferroelectric layers 14 are perpendicular to the top electrodes 16, 18, 20. In one example, the top electrode 14 can accommodate negative pinning, whereas the top electrode 20 can accommodate positive pinning.

Therefore, one approach to memory design is the use of ferroelectric materials 14 sandwiched between pairs of electrodes (12 with 16, 18, 20) to form non-volatile memory cells. A ferroelectric material can be a polymer containing electric dipoles that can uniformly align under certain conditions such as under the influence of electric fields. By forming a plethora of these memory cells, memory circuits can be formed. These circuits can include multiple bottom electrodes 12 laid parallel to each other in one direction and a second set of top electrodes 16, 18, 20 laid over the first set of bottom electrodes 12 and perpendicular to the first set of bottom electrodes 12. A ferroelectric layer 14 is sandwiched between the bottom set of electrodes 12 and the top set of electrodes 16, 18, 20. Memory cells are formed at each point where a top electrode crosses over a bottom electrode. This configuration results in a grid pattern of individual memory cells.

Figure 2:
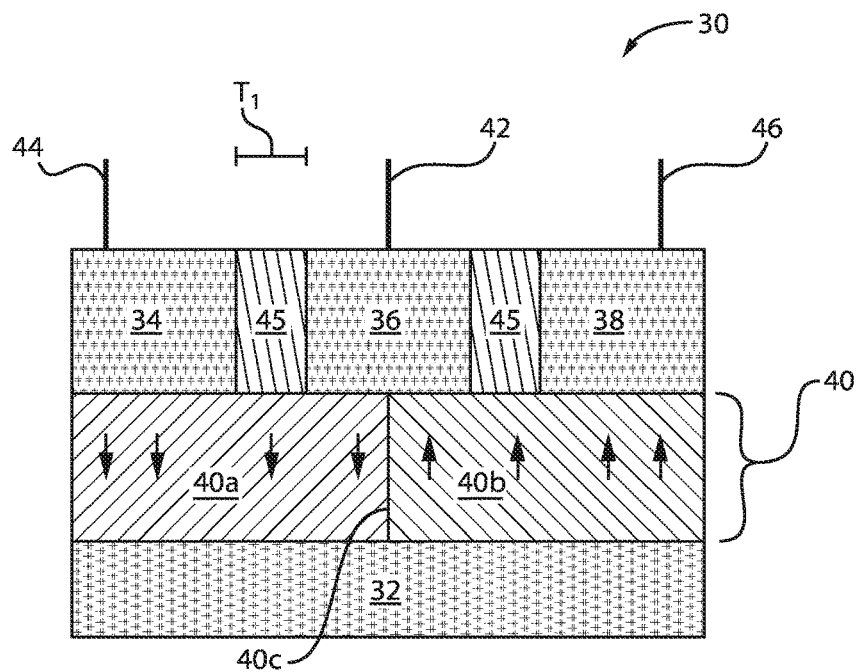
FIG. 2 is a cross-sectional view of a metal-ferroelectric-metal (MFM) structure where the ferroelectric layer is positioned over a bottom electrode, in accordance with an embodiment of the present invention.

FIG. 2 is a cross-sectional view of a metal-ferroelectric-metal (MFM) structure where the ferroelectric layer is positioned over a bottom electrode, in accordance with an embodiment of the present invention.

In various example embodiments, the metal-ferroelectric-metal (MFM) structure 30 includes a bottom electrode 32. A ferroelectric layer 40 is formed over and in direct contact with the bottom electrode 32. The ferroelectric layer 40 includes a first region 40a and a second region 40b. The resistance depends on the direction of polarization in the ferroelectric layer 40. The first region 40a is OFF (high resistance), and the second region 40b is ON (low resistance). As the domain wall 40c moves, the overall resistance of the MFM changes as a fraction of the MFM that is ON changes. The resistance is proportional to the fraction of MFM device area that is OFF. By pulsing the top electrodes 34, 36, 38, the resistance can be varied or adjusted in a controlled manner.

The ferroelectric layer 40 is constructed from ferroelectric materials. Ferroelectric materials are composed of many randomly-distributed permanently polarized regions. When an electric field is applied, the regions with a polarization component in the direction of the electric field grow at the expense of the non-aligned regions so that a net polarization can result. If the electric field decreases, the polarization also decreases but at a slower rate so that even when the electric field becomes zero, a remnant polarization remains. A negative coercive field is needed to bring the polarization to zero. This hysteresis behavior of a ferroelectric material is the basis of ferroelectric nonvolatile memory devices.

Top electrodes 34, 36, 38 are formed over the ferroelectric layer 40. The first top electrode 34 can have a source contact 44, the second top electrode 36 can have a gate contact 42, and the third top electrode 38 can have a drain contact 46. The contacts 42, 44, 46 can be referred to as conductive wires. The top electrodes 34, 36, 38 can be separated from each other by a dielectric material 45. The thickness of the dielectric material can be "$T_1$." A positive voltage can be applied to the source contact 44 and a negative voltage can be applied to the drain contact 46.

A magnetic domain wall 40c can be arranged between the magnetic domain regions 40a, 40b. Thus, the exemplary embodiments involve the use of "domain walls" as a mechanism for storage of information, with such domain walls being located within microscopic (nanoscale) wires of magnetic material. The physics underlying the domain wall memory concept are manifested through a local, microscopic means of shifting the bits along a shift register track. By flowing a sufficiently large spin-polarized current along the nanowire, enough force is imparted from the electrons onto the domain walls such that the domain walls can be moved along the wire. In addition, certain techniques are used to pin the domain walls at regular locations along the wire for simple, reliable readout of the information by a small number of read elements for many bits of information. Therefore, the domain wall acts as a memory, which can be written symmetrically using positive and negative voltages.

The conductive wire 44 can be connected to a first driving device (not shown). The conductive wire 46 can be connected to a second driving device (not shown). The first and second driving devices can be, e.g., transistors or other devices such as diodes. The bias (positive or negative) can be accomplished by a biasing member, such as voltage pins or current sources.

The first and second driving devices, and the first and second conductive wires 44 and 46 can constitute a current applying element or unit for applying a current to the MFM 30 to move the magnetic domain wall 40c. A current for moving the magnetic domain wall 40c can be applied to the MFM 30 by the first and/or the second driving devices. The movement direction of the magnetic domain wall 40c can be determined according to the direction of the current. The magnetic domain wall 40c moves in the direction of the electrons which is opposite to the direction of the current direction.

When a positive voltage is applied to the gate contact 46, polarization of the ferroelectric film 40 occurs with electrons pulled to the top and holes pulled to the bottom of the ferroelectric film 40. Electrons are then accumulated at the bottom surface of the top electrodes 34, 36, 38. This forms a high conductive channel. Therefore the ferroelectric transistor is "ON", i.e. if a voltage bias is placed across the source contact 44 and the drain contact 46, a current will flow through the transistor. The ferroelectric transistor memory is nonvolatile, meaning that the transistor remains in the ON state even after this positive voltage is removed due to the remnant polarization of the ferroelectric film 40.

When a negative voltage is applied to the gate contact 46, opposite polarization occurs in the ferroelectric film 40 with holes pulled to the bottom surface of the top electrodes 34, 36, 38 and electrons pulled to the bottom of the ferroelectric film 40. Holes are then accumulated at the bottom surface of the top electrodes 34, 36, 38. There is no conduction channel, and the ferroelectric transistor is "OFF", i.e. a non-conduction state takes place between the source 42 and drain 46 contacts, which is maintained even after the negative voltage is removed.

While moving the magnetic domain wall 40c in a bit unit by applying a given or desired pulse current to the MFM 30 employing the first and/or second driving devices, data recorded in the MFM 30 can be reproduced by applying a reading current to a reading unit (not shown) and data can be recorded onto the MFM 30 by applying a write current to the writing unit (not shown).

The ferroelectric layer 40 disclosed in the present invention is preferably constructed from any of the following: HfO2, HfZrO, HfO2 doped with Si, Al, Y, La etc. Pb(Zr, Ti)O$_3$ (PZT), SrBi$_2$Ta$_2$O$_9$ (SBT), Pb$_5$Ge$_3$O$_{11}$(PGO), BaTiO$_3$, or LiNbO$_3$, but any ferroelectric material exhibiting hysteresis effect can be employed in the conductive oxide ferroelectric transistor.

The bottom electrode 32 and the top electrodes 34, 36, 38 are preferably a metal layer such as aluminum, platinum or iridium, and more preferably a conductive layer, a conductive oxide layer, a conductive metal oxide layer, or a multilayer such as conductive oxide/metal, or conductive metal oxide/metal. Moreover, the electrode material can be any type of conductive material that may be suitable for such purpose. These include materials such as but are not limited to nitrides or oxides such as titanium nitride or tantalum nitride, aluminum, aluminum alloy, copper, copper alloy, titanium, titanium alloy, and silicides (such as silicides including tungsten, titanium, nickel and cobalt).

Figure 3:
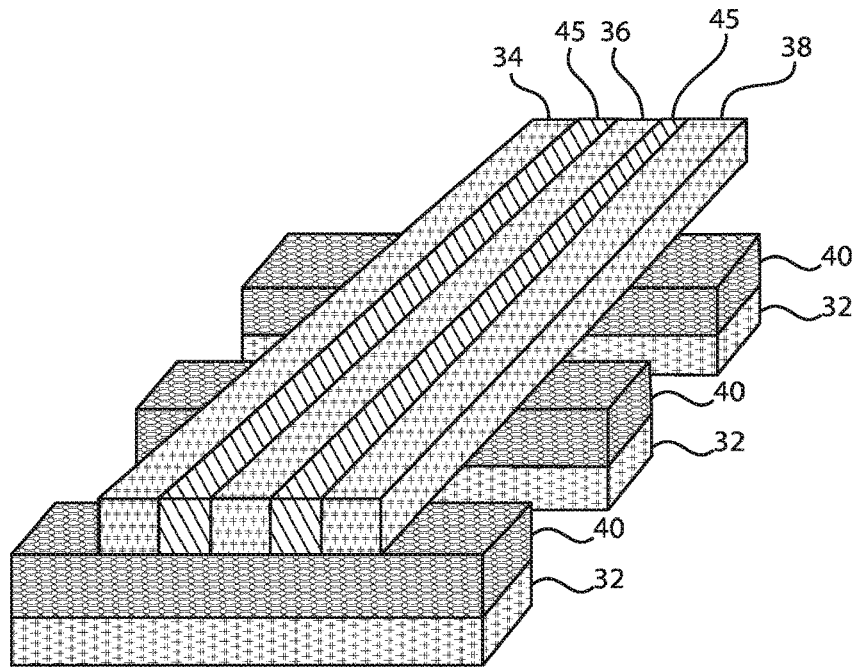
FIG. 3 is a perspective view of the MFM structure of FIG. 2 illustrating the ferroelectric layers positioned over the bottom electrodes, in accordance with an embodiment of the present invention.

FIG. 3 is a perspective view of the MFM structure of FIG. 2 illustrating the ferroelectric layers positioned over the bottom electrodes, in accordance with an embodiment of the present invention.

A plurality of ferroelectric layers 40 are shown over a plurality of bottom electrodes 32 of a cross-bar array. Additionally, the top electrodes 34, 36, 28 are shown perpendicular to the plurality of ferroelectric layers 40 and perpendicular to the plurality of bottom electrodes 32.

Figure 4:
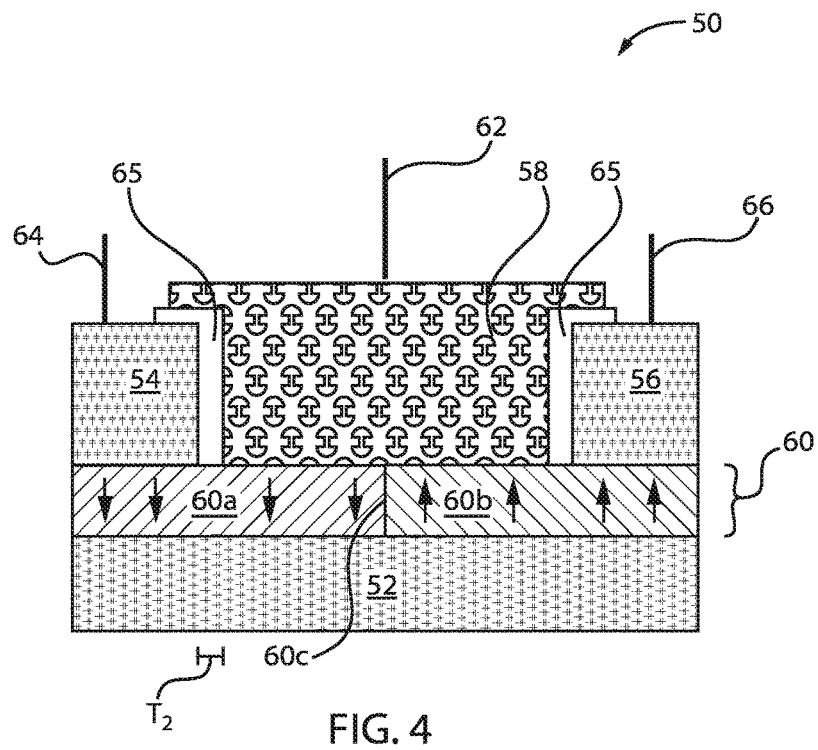
FIG. 4 is a cross-sectional view of a metal-ferroelectric-metal (MFM) structure where the ferroelectric layer is positioned over a bottom electrode and spacers are inserted between top electrodes, in accordance with another embodiment of the present invention.

FIG. 4 is a cross-sectional view of a metal-ferroelectric-metal (MFM) structure where the ferroelectric layer is positioned over a bottom electrode and spacers are inserted between top electrodes, in accordance with another embodiment of the present invention.

In various example embodiments, the metal-ferroelectric-metal (MFM) structure 50 includes a bottom electrode 52. A ferroelectric layer 60 is formed over the bottom electrode 52. The ferroelectric layer 60 includes a first region 60a and a second region 60b. The ferroelectric layer 60 is constructed from ferroelectric materials.

Top electrodes 54, 56, 58 are formed over the ferroelectric layer 60. The first top electrode 54 can have a source contact 64, the second top electrode 56 can have a drain contact 66, and the third top electrode 58 can have a gate contact 62. The contacts 62, 64, 66 can be referred to as conductive wires. The top electrodes 54, 56, 58 can be separated from each other by spacers 65. The spacers 65 can directly contact sidewalls of top electrodes 54, 56, 58. The thickness of the spacers can be "$T_2$." The spacers 65 can be constructed from silicon nitride or silicon dioxide. However, the spacers 65 can include any dielectric or insulation material. The spacers 65 can have a thickness of about 10 nm to about 30 nm. The thickness of the spacers 65 is less than the thickness of the top electrodes 54, 56, 58. In one example, the thickness of the spacers 65 is less than half the thickness of the top electrodes 54, 56, 58. The spacer material can be deposited using, for example, plasma enhanced chemical vapor deposition (PECVD), non-ferroelectric polymer spin deposition, or by other suitable means.

A positive voltage can be applied to the source contact 64 and a negative voltage can be applied to the drain contact 66. A magnetic domain wall 60c can be arranged between the magnetic domain regions 60a, 60b. The movement direction of the magnetic domain wall 60c can be determined according to the direction of the current. The magnetic domain wall 60c moves in the direction of the electrons which is opposite to the direction of the current direction. The movement of the domain wall 60c is similar to the movement of domain wall 40c of FIG. 4 described above.

Figure 5:
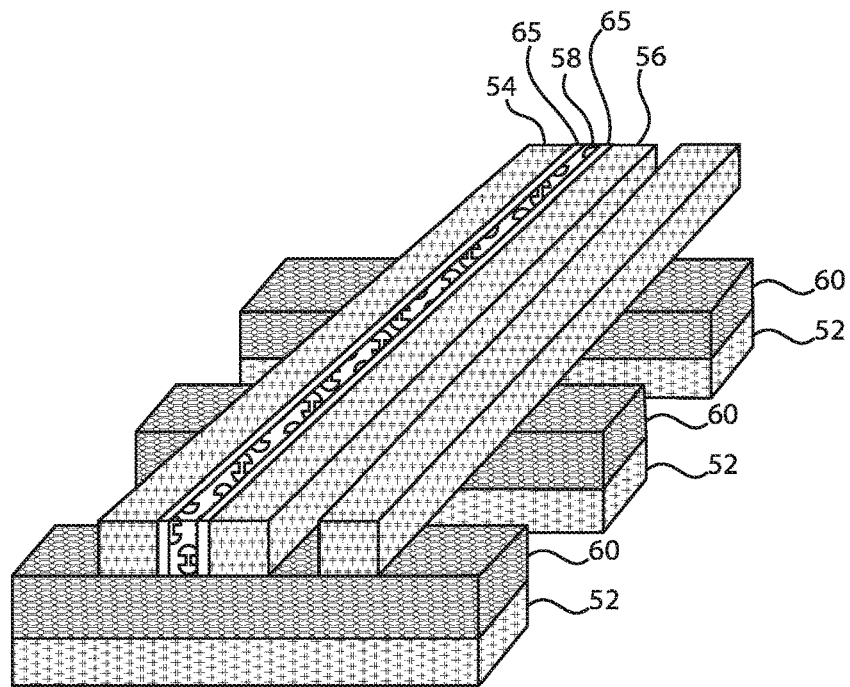
FIG. 5 is a perspective view of the MFM structure of FIG. 4 where the ferroelectric layer is positioned over a bottom electrode and spacers are inserted between top electrodes for better aspect ratio control, in accordance with an embodiment of the present invention.

FIG. 5 is a perspective view of the MFM structure of FIG. 4 where the ferroelectric layer is positioned over a bottom electrode and spacers are inserted between top electrodes for better aspect ratio, in accordance with an embodiment of the present invention.

A plurality of ferroelectric layers 60 are shown over a plurality of bottom electrodes 52 of a cross-bar array. Additionally, the top electrodes 54, 56, 58 are shown perpendicular to the plurality of ferroelectric layers 60 and perpendicular to the plurality of bottom electrodes 52.

Figure 6:
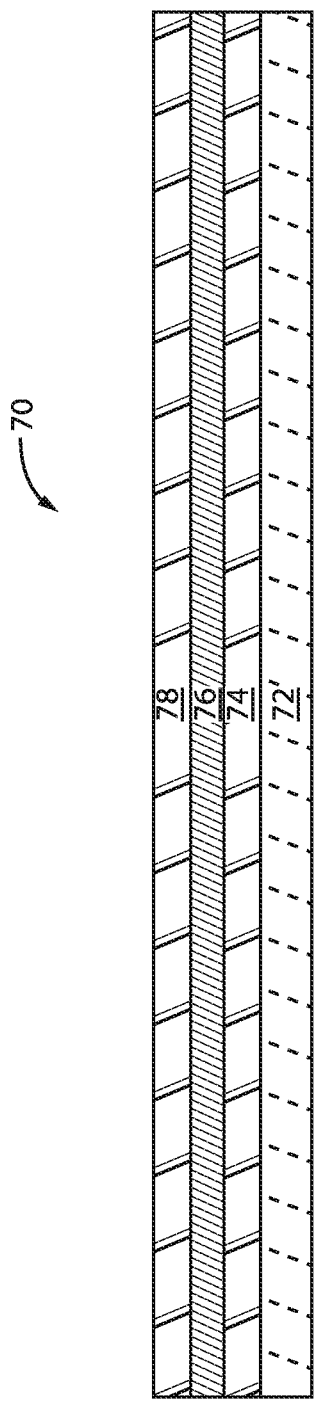
FIG. 6 is a cross-sectional view of a metal-ferroelectric-metal (MFM) structure including a bottom electrode, a ferroelectric layer, and a sacrificial top electrode, in accordance with an embodiment of the present invention.

FIG. 6 is a cross-sectional view of a metal-ferroelectric-metal (MFM) structure 70 including a bottom electrode, a ferroelectric layer, and a sacrificial top electrode, in accordance with an embodiment of the present invention.

FIG. 6 illustrates the construction of structure 50 of FIG. 4. In various example embodiments, a bottom electrode 74 is formed over a substrate 72. A ferroelectric layer 76 is formed over the bottom electrode 74. A sacrificial top electrode 78 is formed over the ferroelectric layer 76.

The semiconductor substrate 72 that is employed in the present application can include any semiconductor material. Illustrative examples of semiconductor materials that can be used for the semiconductor substrate 72 include, but are not limited to, Si, SiGe alloys, SiGeC, SiC, Ge alloy, GaSb, GaP, GaN, GaAs, InAs, INP, AN and all other III-V or II-VI compound semiconductors. In one embodiment, the semiconductor substrate 72 can include a multilayered stack of such semiconductor materials. In some embodiments, the semiconductor substrate 72 can include a bulk semiconductor substrate. By "bulk" it is meant the entirety of the semiconductor substrate 72 from one surface to an opposite surface is composed of a semiconductor material. In other embodiments, the semiconductor substrate 72 can include a semiconductor-on-insulator (SOI) substrate including a handle substrate, a buried insulator layer and a top semiconductor material layer.

Figure 7:
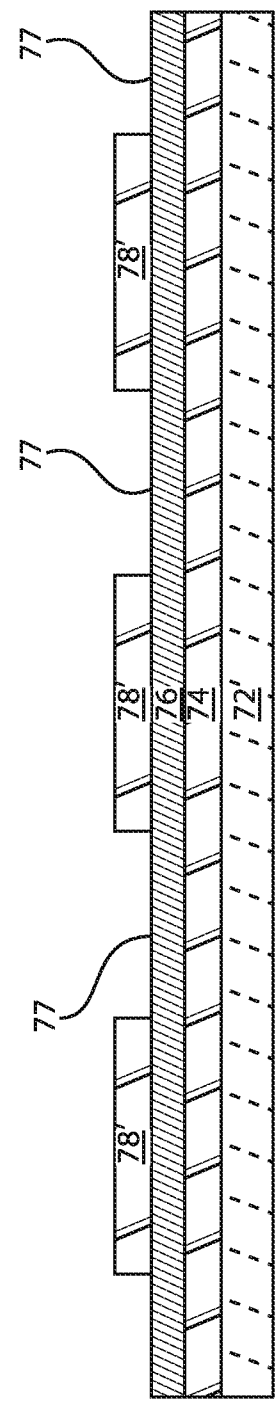
FIG. 7 is a cross-sectional view of the MFM structure of FIG. 6 where the sacrificial top electrode is patterned, in accordance with an embodiment of the present invention.

FIG. 7 is a cross-sectional view of the MFM structure of FIG. 6 where the sacrificial top electrode is patterned, in accordance with an embodiment of the present invention.

In various example embodiments, the sacrificial top electrode 78 is patterned, thus resulting in multiple sacrificial top electrodes 78'. Additionally, a top surface 77 of the ferroelectric layer 76 is exposed.

Figure 8:
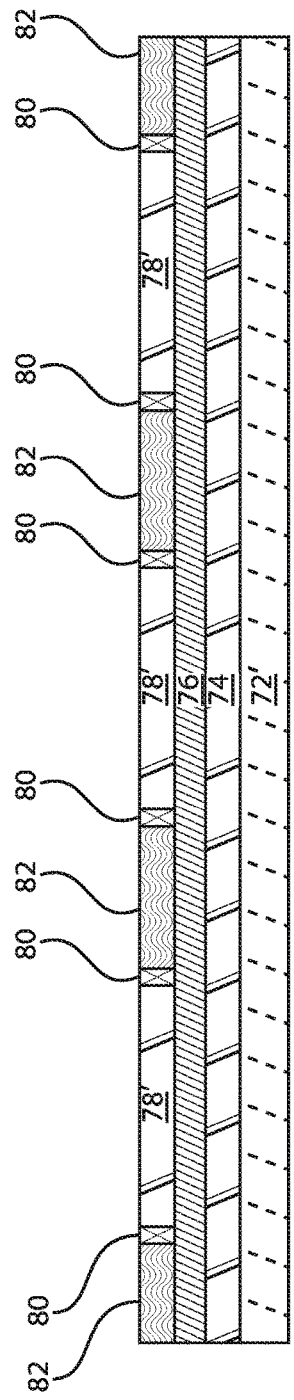
FIG. 8 is a cross-sectional view of the MFM structure of FIG. 7 where spacers are inserted between the patterned sacrificial top electrodes, in accordance with an embodiment of the present invention.

FIG. 8 is a cross-sectional view of the MFM structure of FIG. 7 where spacers are inserted between the patterned sacrificial top electrodes, in accordance with an embodiment of the present invention.

In various example embodiments, top electrodes 82 are formed between spacers 80. The spacers 80 separate the top electrodes 82 from the multiple sacrificial top electrodes 78'.

Figure 9:
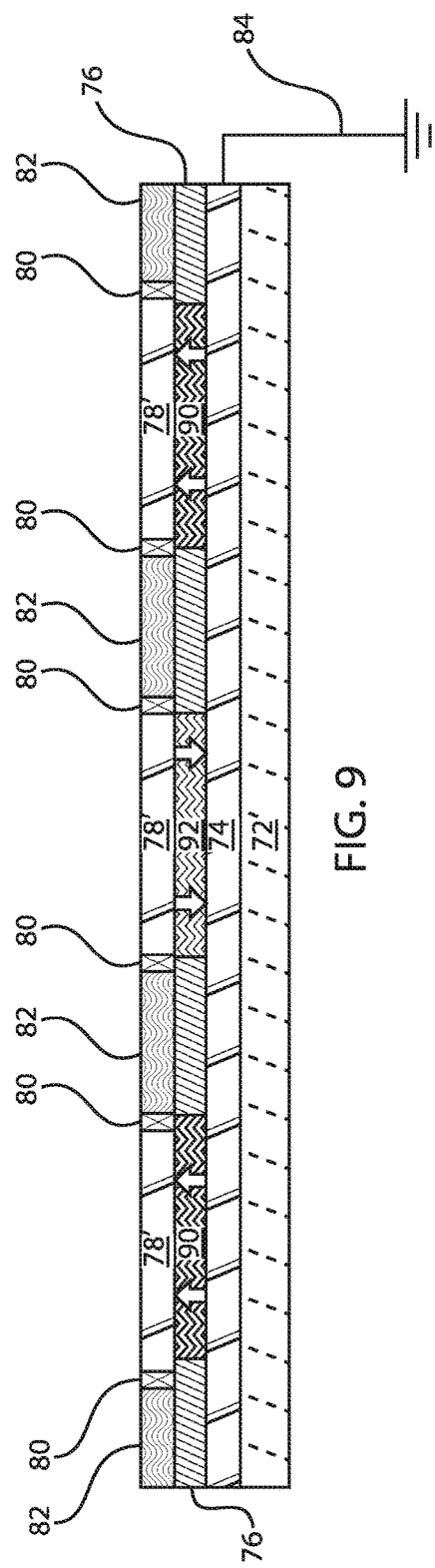
FIG. 9 is a cross-sectional view of the MFM structure of FIG. 8 where pinning regions are established between the bottom electrode and patterned sacrificial top electrodes, in accordance with an embodiment of the present invention.

FIG. 9 is a cross-sectional view of the MFM structure of FIG. 8 where pinning regions are established between the bottom electrode and patterned sacrificial top electrodes, in accordance with an embodiment of the present invention.

In various example embodiments, pinning regions 90, 92 are established when a current is applied to the structure, which is also grounded at 84. Application of a positive voltage results in pinning regions 90 and application of a negative voltage results in pinning region 92. Therefore, the polarizations are set in the pinned regions 90, 92 with a DC bias between the bottom electrode 74 and the multiple sacrificial top electrodes 78'.

Figure 10:
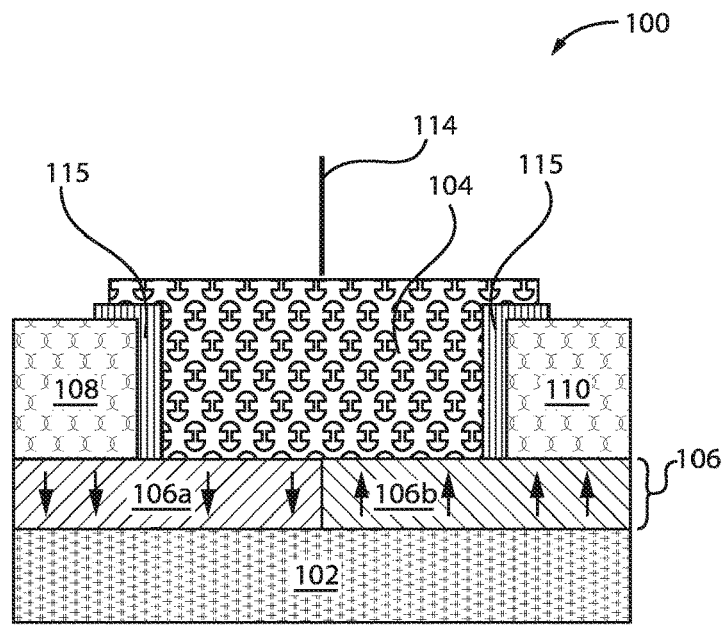
FIG. 10 is a cross-sectional view of a metal-ferroelectric-metal (MFM) structure where first ferroelectric layers are positioned over a bottom electrode and second ferroelectric layers are positioned over the first ferroelectric layers and adjacent the top electrodes, in accordance with another embodiment of the present invention.

FIG. 10 is a cross-sectional view of a metal-ferroelectric-metal (MFM) structure where first ferroelectric layers are positioned over a bottom electrode and second ferroelectric layers are positioned over the first ferroelectric layers and adjacent the top electrodes, in accordance with another embodiment of the present invention.

In various example embodiments, the metal-ferroelectric-metal (MFM) structure 100 includes a bottom electrode 102. A first ferroelectric layer 106 is formed over the bottom electrode 102. The first ferroelectric layer 106 can include a first region 106a and a second region 106b.

A top electrode 104 can be formed over the first ferroelectric layer 106. The top electrode 104 can have a gate contact 114. The gate contact 114 can be referred to as a conductive wire. The top electrode 104 can include spacers 115 adjacent thereto. The spacers 115 can separate the top electrode 104 from a plurality of second ferroelectric layers 108, 110. The second ferroelectric layers 108, 110 are thicker than the first ferroelectric layers 106. The second ferroelectric layers 108, 110 can be pinned during processing. The second ferroelectric layers 108, 110 have a higher coercive field that that of the first ferroelectric layers 106, thus making it difficult to switch the pinned second ferroelectric layers 108, 110 (even after the pinning bias is removed).

The spacers 115 can directly contact sidewalls of the second ferroelectric layers 108, 110. The spacers 115 can shield the pinning regions during operation. The spacers 115 can be constructed from silicon nitride or silicon dioxide. However, the spacers 115 can include any dielectric or insulation material. The spacers 115 can have a thickness of about 10 nm to about 100 nm. The spacer material can be deposited in low temperature (below 400° C.) using, for example, plasma enhanced chemical vapor deposition (PECVD), non-ferroelectric polymer spin deposition, or by other suitable means.

Figure 11:
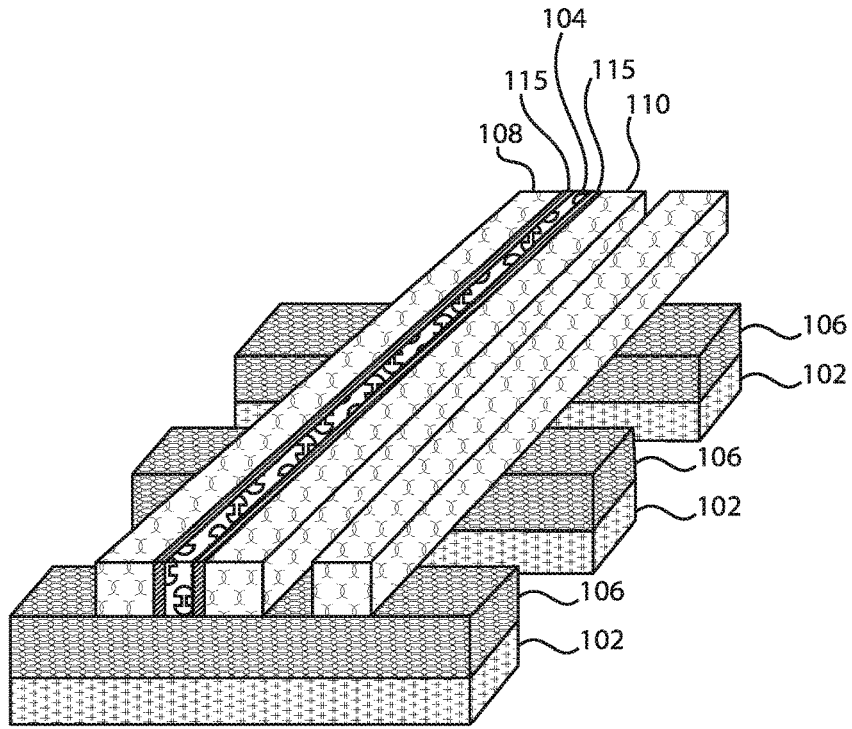
FIG. 11 is a perspective view of the metal-ferroelectric-metal (MFM) structure of FIG. 10 where first ferroelectric layers are positioned over a bottom electrode and second ferroelectric layers are positioned over the first ferroelectric layers and adjacent the top electrodes, in accordance with another embodiment of the present invention.

FIG. 11 is a perspective view of the metal-ferroelectric-metal (MFM) structure of FIG. 10 where first ferroelectric layers are positioned over a bottom electrode and second ferroelectric layers are positioned over the first ferroelectric layers and adjacent the top electrodes, in accordance with another embodiment of the present invention.

A plurality of first ferroelectric layers 106 are shown over a plurality of bottom electrodes 102 of a cross-bar array. Additionally, the top electrode 104 and the plurality of second ferroelectric layers 108, 110 are shown perpendicular to the plurality of first ferroelectric layers 106 and perpendicular to the plurality of bottom electrodes 102.

FIG. 12 is a cross-sectional view of a metal-ferroelectric-metal (MFM) structure 120 including a bottom electrode, a first ferroelectric layer, a second ferroelectric layer, and a sacrificial top electrode, in accordance with an embodiment of the present invention.

FIG. 12 illustrates the construction of structure 100 of FIG. 10. In various example embodiments, a bottom electrode 124 is formed over a substrate 122. A first ferroelectric layer 126 is formed over the bottom electrode 124. A second ferroelectric layer 128 is formed over the first ferroelectric layer 126. A sacrificial top electrode 130 is formed over the second ferroelectric layer 128.

FIG. 13 is a cross-sectional view of the MFM structure of FIG. 12 where the sacrificial top electrode is patterned, in accordance with an embodiment of the present invention.

In various example embodiments, the sacrificial top electrode 130 is patterned, thus resulting in multiple sacrificial top electrodes 130'. Additionally, a top surface 129 of the second ferroelectric layer 128 is exposed.

FIG. 14 is a cross-sectional view of the MFM structure of FIG. 13 where pinning regions are established between the bottom electrode and the patterned sacrificial top electrodes, in accordance with an embodiment of the present invention.

In various example embodiments, pinning regions 132, 134 are established when a current is applied to the structure. Application of a positive voltage results in regions 132 and application of a negative voltage results in region 134. Therefore, the polarizations are set in the pinned regions 132, 134 with a DC bias between the bottom electrode 124 and the multiple sacrificial top electrodes 130'.

FIG. 15 is a cross-sectional view of the MFM structure of FIG. 14 where remaining portions of the second ferroelectric layer are removed, in accordance with an embodiment of the present invention.

In various example embodiments, the second ferroelectric layer 128 is removed to expose a top surface 127 of the first ferroelectric layer 126. Additionally, spacers 136 are formed adjacent the sidewalls of the multiple sacrificial top electrodes 130', as well as the exposed sidewalls of the pinned regions 132, 134.

FIG. 16 is a cross-sectional view of the MFM structure of FIG. 15 where a top electrode is deposited, in accordance with an embodiment of the present invention.

In various example embodiments, a top electrode 140 is deposited over the top surface 127 of the first ferroelectric layer 126.

FIG. 17 is a cross-sectional view of the MFM structure of FIG. 16 where the patterned sacrificial top electrodes are removed, in accordance with an embodiment of the present invention.

In various example embodiments, the sacrificial top electrode sections 130' are removed to expose sidewalls 137 of the spacers 136 and to expose a top surface 133 of the pinning region 132 and to expose a top surface 135 of the pinning region 134. This further results in recesses or gaps 142 formed over the top surfaces 133, 135 of pinning regions 132, 134, respectively.

Moreover, it is noted that the ferroelectric (FE) film deposition can be on either or both conduction lines for various density requirements. The exemplary embodiments can pertain to 1D, 2D or 3D structures. Also, in alternative embodiments, the ferroelectric films can be single layer FE films or FE stacks with buffer layers below or above if needed. The conductor lines using conventional metals, can also insert other layers if necessary.

It will be helpful in appreciating the effects of the invention in the following discussion to recall that selectivity of etching is generally a function of a difference in etch rates of different materials for a given etchant chemistry. Therefore, factors that tend to slow the etching of the selectively etched material tends to reduce effective selectivity to other materials and that best selectivity will be observed when the etch progresses as rapidly as possible.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for creating a metal-ferroelectric-metal (MFM) structure and incorporating such MFM structure into a cross-bar array for domain wall movement (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for incorporating a metal-ferroelectric-metal (MFM) structure in a cross-bar array in back end of the line (BEOL) processing, the method comprising:
   forming a first electrode;
   forming a ferroelectric layer in direct contact with the first electrode;
   forming a second electrode in direct contact with the ferroelectric layer, such that the first electrode and the ferroelectric layer are perpendicular to the second electrode to form the cross-bar array; and
   biasing the second electrode to adjust domain wall movement within the ferroelectric layer.

2. The method of claim 1, wherein the second electrode includes a plurality of second electrodes separated by a plurality of spacers.

3. The method of claim 2, wherein a thickness of each of the plurality of spacers is less than a thickness of the second electrode.

4. The method of claim 1, wherein the biasing is conducted via pinning voltages.

5. The method of claim 1, wherein the biasing is conducted via current source lines.

6. The method of claim 1, wherein resistance of the ferroelectric layer can be controlled by the domain wall movement adjustment.

7. A metal-ferroelectric-metal (MFM) structure, the structure comprising:
   a first electrode;
   a first ferroelectric layer in direct contact with the first electrode;
   a second electrode in direct contact with the first ferroelectric layer, such that the first electrode and the first ferroelectric layer are perpendicular to the second electrode to construct a cross-bar array; and
   biasing members for providing current to the second electrode to adjust domain wall movement within the first ferroelectric layer.

8. The structure of claim 7, wherein the second electrode includes a plurality of second electrodes separated by a plurality of spacers.

9. The structure of claim 8, wherein a thickness of each of the plurality of spacers is less than a thickness of the second electrode.

10. The structure of claim 7, wherein the biasing is conducted via pinning voltages.

11. The structure of claim 7, wherein the biasing is conducted via current source lines.

12. The structure of claim 7, wherein resistance of the first ferroelectric layer can be controlled by the domain wall movement adjustment.

13. The structure of claim 7, wherein a second ferroelectric layer is disposed adjacent the second electrode.

14. The structure of claim 7, wherein a second ferroelectric layer is disposed over the first ferroelectric layer.

15. The structure of claim 7, wherein a second ferroelectric layer is disposed perpendicular to the first ferroelectric layer.

16. A metal-ferroelectric-metal (MFM) structure, the structure comprising:
- a first electrode;
- a first ferroelectric layer in direct contact with the first electrode;
- a second ferroelectric layer disposed over the first ferroelectric layer;
- a second electrode in direct contact with the first and second ferroelectric layers, such that the first electrode and the first ferroelectric layer are perpendicular to the second electrode and the second ferroelectric layer to construct a cross-bar array; and
- biasing members for providing current to the second electrode to adjust domain wall movement within the first ferroelectric layer.

17. The structure of claim 16, wherein the second electrode includes spacers on opposed ends thereof.

18. The structure of claim 17, wherein a thickness of the spacers is less than a thickness of the second electrode.

19. The structure of claim 16, wherein the biasing is conducted via pinning voltages.

20. The structure of claim 16, wherein the biasing is conducted via current source lines.

* * * * *